(12) United States Patent
Furland et al.

(10) Patent No.: US 8,451,018 B2
(45) Date of Patent: May 28, 2013

(54) BIT FAILURE SIGNATURE IDENTIFICATION

(75) Inventors: Thomas D. Furland, Essex Junction, VT (US); Robert J. Milne, Jr., Jericho, VT (US); Leah M. P. Pastel, Essex, VT (US); Kevin W. Stanley, Milton, VT (US); Robert C. Virun, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 498 days.

(21) Appl. No.: 12/706,228

(22) Filed: Feb. 16, 2010

(65) Prior Publication Data

US 2011/0199114 A1 Aug. 18, 2011

(51) Int. Cl.
*G01R 31/26* (2006.01)

(52) U.S. Cl.
USPC .................................................. 324/762.01

(58) Field of Classification Search
USPC .... 324/762.01–762.1, 750.01–750.3; 257/48; 438/14–18; 714/723, 715
See application file for complete search history.

(56) References Cited

U.S. PATENT DOCUMENTS

| | | | |
|---|---|---|---|
| 6,553,521 B1 * | 4/2003 | Rathei et al. | 714/722 |
| 6,880,136 B2 | 4/2005 | Huisman et al. | |
| 7,197,435 B1 | 3/2007 | Erhardt et al. | |
| 7,356,430 B2 | 4/2008 | Miguelanez et al. | |
| 7,596,736 B2 * | 9/2009 | Kassab et al. | 714/732 |
| 2007/0226556 A1 | 9/2007 | Fong et al. | |

OTHER PUBLICATIONS

Anthony et al., "Generative Models for Clustering: The Next Generation", Association for the Advancement of Artificial Intelligence (www.aaai.org), 2008, 4 pgs.
Sanchez, "Pathmox: A PLS-PM Segmentation Algorithm",2006, http://www.iasc-isi-org/Proceedings/2006/COMPSTAT_Satellites/KNEMO/Lavori/Papers%20CD/Sanchez%20Aluja.pdf, 9 pgs.
Magidson et al., "An Extension of the CHAID Tree-based Segmentation Algorithm to Multiple Dependent Variables", http://www.statisticalinnovations.com/products/8pagearticle.pdf, Date Unknown, 8 pgs.
Jagan et al., "Efficient Grouping of Fail Chips for Volume Yield Diagnostics", 2009, pp. 97-102, 2009 22nd International Conference on VLSI Design.

* cited by examiner

*Primary Examiner* — Tung X Nguyen
(74) *Attorney, Agent, or Firm* — Richard M. Kotulak; Hoffman Warnick LLC

(57) ABSTRACT

A method, system, and program product for identifying at least one bit failure among a plurality of semiconductor chips are provided. A first aspect of the invention provides a method of identifying at least one bit failure signature among a plurality of semiconductor chips, the method comprising: counting failures of each failing bit among the plurality of semiconductor chips; determining a most commonly failing bit (MCFB) among the failing bits; establishing a bit failure signature including the MCFB; counting failures of each failing bit on semiconductor chips on which the MCFB fails; determining a next most commonly failing bit (NMCFB) among the failing bits on semiconductor chips on which the MCFB fails; determining whether the NMCFB tends to fail when the MCFB fails; and in response to a determination that the NMCFB tends to fail when the MCFB fails, adding the NMCFB to the bit failure signature.

23 Claims, 5 Drawing Sheets

FIG. 3

| | Signature A Scores | | |
|---|---|---|---|
| | Signature | Total | Pattern |
| Chip A | 1000 | 1000 | 667 |
| Chip B | 1000 | 1000 | 667 |
| Chip C | 1000 | 700 | 667 |
| Chip D | 750 | 700 | 550 |
| Chip E | 600 | 500 | 700 |
| Chip F | 500 | 100 | 120 |
| ⋮ | ⋮ | ⋮ | ⋮ |
| Chip Z | 100 | 100 | 240 |

BIT FAILURE SIGNATURE IDENTIFICATION

TECHNICAL FIELD

Embodiments of the present invention relate generally to semiconductor chip manufacture and, more particularly, to the identification of bit failure signatures among a plurality of semiconductor chips, where the presence of a bit failure signature, or a portion thereof, among a plurality of semiconductor chips is indicative of a systematic defect or failure.

BACKGROUND

Systematic defects are known to occur during the manufacture of semiconductor devices, including semiconductor chips. Identifying these systematic defects and correcting them is essential for the efficient, cost-effective manufacture of reliable semiconductor devices.

Identifying pin/bits (hereinafter "bits") that tend to fail together and the chips having those failing bits is useful in identifying such systematic defects, but the very high volume of data involved in making such identifications currently requires a level of testing and analysis that renders known methods both time-consuming and expensive. Some methods involve a bit-by-bit comparison between chips, which becomes prohibitive when dealing with a large number of chips. Known methods are also ineffective and/or inefficient in identifying rare systematic defects that may be caused by a frequently-used design feature, but which only rarely causes failures in the same location. Identifying such rare defects may require an analysis of hundreds of thousands of chips, a prospect prohibited by known methods of defect identification.

SUMMARY

A method, system, and program product for identifying at least one bit failure signature among a plurality of semiconductor chips are provided.

A first aspect of the invention provides a method of identifying at least one bit failure signature among a plurality of semiconductor chips, the method comprising: counting failures of each failing bit among the plurality of semiconductor chips; determining a most commonly failing bit (MCFB) among the failing bits; establishing a bit failure signature including the MCFB; counting failures of each failing bit on semiconductor chips on which the MCFB fails; determining a next most commonly failing bit (NMCFB) among the failing bits on semiconductor chips on which the MCFB fails; determining whether the NMCFB tends to fail when the MCFB fails; and in response to a determination that the NMCFB tends to fail when the MCFB fails, adding the NMCFB to the bit failure signature.

A second aspect of the invention provides a computer system comprising: a set of computing devices configured to identify at least one bit failure signature by performing actions comprising: counting failures of each failing bit among the plurality of semiconductor chips; determining a most commonly failing bit (MCFB) among the failing bits; establishing a bit failure signature including the MCFB; counting failures of each failing bit on semiconductor chips on which the MCFB fails; determining a next most commonly failing bit (NMCFB) among the failing bits on semiconductor chips on which the MCFB fails; determining whether the NMCFB tends to fail when the MCFB fails; and in response to a determination that the NMCFB tends to fail when the MCFB fails, adding the NMCFB to the bit failure signature.

A third aspect of the invention provides a computer program comprising program code embodied in at least one computer-readable storage medium, which when executed, enables a computer system to implement a method of identifying at least one bit failure signature among a plurality of semiconductor chips, the method comprising: counting failures of each failing bit among the plurality of semiconductor chips; determining a most commonly failing bit (MCFB) among the failing bits; establishing a bit failure signature including the MCFB; counting failures of each failing bit on semiconductor chips on which the MCFB fails; determining a next most commonly failing bit (NMCFB) among the failing bits on semiconductor chips on which the MCFB fails; determining whether the NMCFB tends to fail when the MCFB fails; and in response to a determination that the NMCFB tends to fail when the MCFB fails, adding the NMCFB to the bit failure signature.

A fourth aspect of the invention provides a method of identifying a physical feature signature among a plurality of items, the method comprising: counting occurrences of each of a plurality of physical features among a plurality of items; determining a most commonly occurring physical feature among the plurality of physical features; establishing a physical feature signature including the most commonly occurring physical feature; counting occurrences of each physical feature occurring with the most commonly occurring physical feature among the plurality of items; determining a next most commonly occurring physical feature among the physical features occurring with the most commonly occurring physical feature; determining whether the next most commonly occurring physical feature tends to occur with the most commonly occurring physical feature; and in response to a determination that the next most commonly occurring physical feature tends to occur with the most commonly occurring physical feature, adding the next most commonly occurring physical feature to the physical feature signature.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 3 shows a table of bit failure scores calculated for a plurality of chips;

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
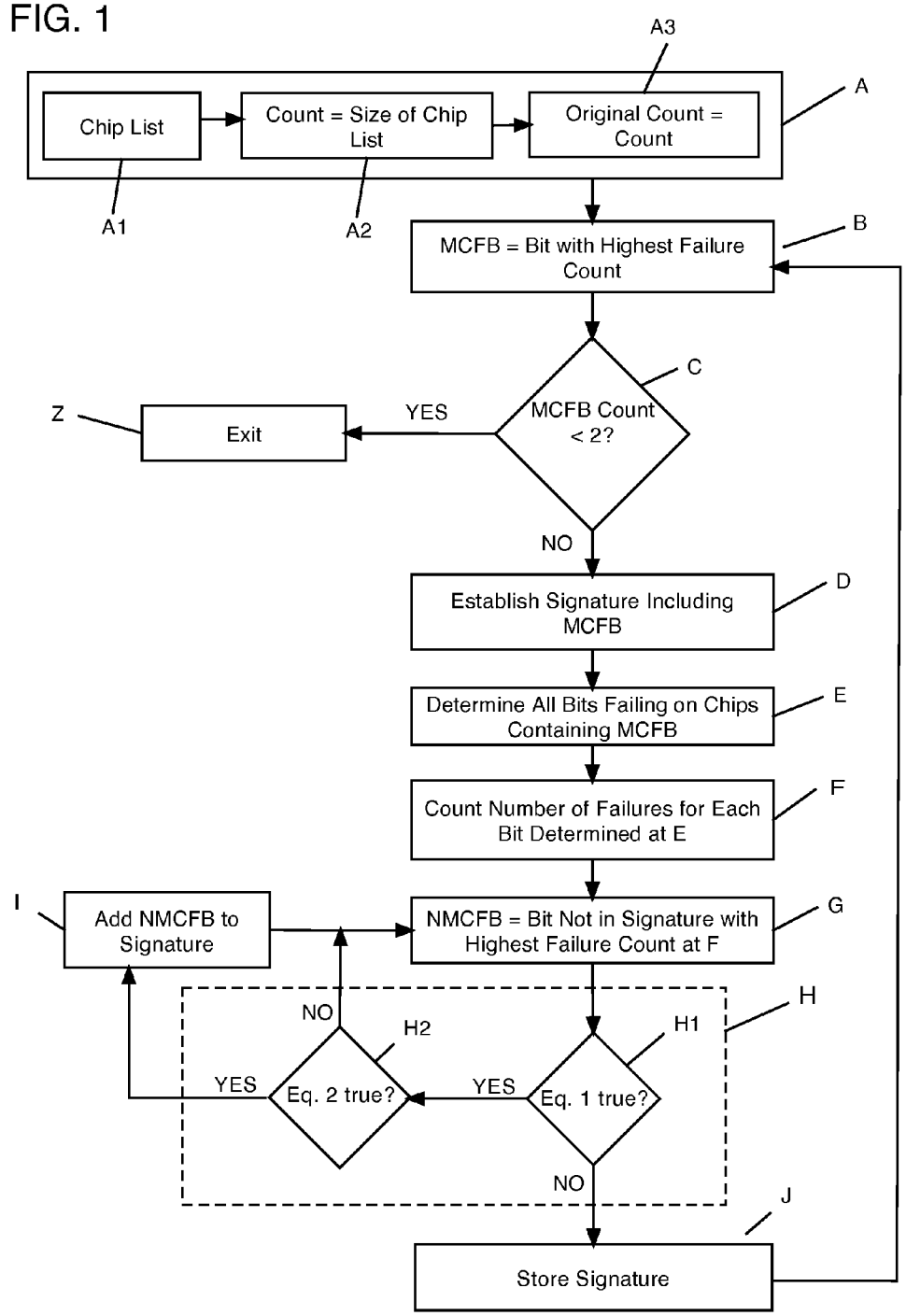
FIG. 1 shows a flow diagram of a method of identifying a bit failure signature according to an embodiment of the invention.

Turning now to the drawings, FIG. 1 shows a flow diagram of a method according to an embodiment of the invention.

The method shown in FIG. 1 is specific to the identifying of a bit failure signature among a plurality of semiconductor chips. However, as will be described in greater detail below, methods according to other embodiments of the invention are more broadly applicable to identifying a feature signature among a plurality of items. Those skilled in the art will recognize that tests of a chip may occur under a plurality of conditions and that the results of each condition may need to be kept separately and be treated as if coming from different chips for the purpose of interpreting this invention.

At A, a series of steps are performed for each failing bit among a plurality of semiconductor chips. As used herein, a failing bit refers to a bit that does not contain an expected value after a pattern of values is applied to the chip. For example, if a pattern of values is expected to result in a "1" at bit 1, after applying the pattern to a chip, that bit 1 should contain a value of "1." If bit 1 does not contain a value of "1" after applying the pattern to the chip, bit 1 is considered to be a failing bit.

At A1, a chip list is compiled for each failing bit. The chip list includes the set of chips which include the failing bit. For example, assume, merely for the sake of illustration, that the plurality of semiconductor chips includes 100 chips. If bit 1 is found to fail at least once among the 100 chips, the chip list compiled at A1 would include a list of all chips in which bit 1 failed.

At A2, the bit failure count is set equal to the size of the chip list compiled at A1. That is, if the chip list for bit 1 includes 10 chips, the count at A2 for bit 1 is set to 10, representing 10 chips on which bit 1 failed at least once during testing. At A3, the count set at A2 is saved by setting the original bit failure count equal to the count set at A2. As will be described in greater detail below, determining a bit failure signature may require altering the counts at A2. As noted above, A1 through A3 are performed for each failing bit among the plurality of semiconductor chips.

At B, the most commonly failing bit (MCFB) is set to be the bit with the highest count at A2. At C, a determination is made as to whether the MCFB count is less than 2. If so (i.e., YES at C), the method is exited at Z. If not (i.e., NO at C), a signature is established at D which includes the MCFB. For example, continuing with the example begun above, if bit 1 is found to fail on 10 chips, the determination at C would be "No" (i.e., MCFB count is not less than 2) and the signature is established as including bit 1, the MCFB. As will be described below, inclusion of the MCFB in the signature at D comprises the initial establishment of the signature. Additional failing bits may be added to the signature as described below. Upon including the MCFB in the signature at D, the MCFB count set at A2 is set to zero. Also at D, the PBIT (previous bit) is set to the MCFB.

At E, all bits failing on chips containing the MCFB (i.e., chips from the chip list of the MCFB) are determined. For example, continuing with the example above in which the MCFB fails 10 times (i.e., bit 1 fails on 10 chips among the plurality of chips), all other bits failing on the 10 chips are determined.

At F, a count is made for each bit determined at E. This count is the number of chips which include as failing bits both the MCFB and the particular bit determined at E. That is, the count for each bit determined at E will be at least one, but may be between one and the count of the MCFB inclusive.

At G, the next most commonly failing bit (NMCFB) is set to be the bit with the highest failure count at F that is not already included in the signature. Initially, PBIT is the MCFB and, as will become clear below, in subsequent iterations of the method of FIG. 1, the NMCFB in the immediately previous iteration will be referred to as the previous bit (PBIT). For example, if it was determined at E that there were three bits failing on the 10 chips that contained the MCFB and that these failures occurred a total of nine (bit 2), seven (bit 3), and two (bit 4) of the 10 chips, respectively, the NMCFB would be bit 2 and the PBIT would be bit 1.

The inclusion of the NMCFB in the signature is only useful if the NMCFB tends to fail with the MCFB and thereby suggests a correlation and possibly common cause or origin for the failures. Stated differently, it would be desirable to exclude from the signature those bits that often do not fail when the MCFB fails. Also it is desirable to exclude those bits that often fail when the MCFB does not fail.

Accordingly, the determination at H often involves one or more calculations related to the frequency with which the PBIT and the NMCFB determined at G tend to fail together. For example, two calculations that have proved useful in establishing bit failure signatures are:

$$(\text{NMCFB count}) \times \alpha > (\text{PBIT count}) \qquad \text{Eq. 1}$$

$$(\text{NMCFB count}) \times \beta \geqq (\text{NMCFB original count}) \qquad \text{Eq. 2}$$

In Equation 1 above, the product of the count of the NMCFB determined at F and a first parameter $\alpha$ (in the context of bit failure signatures, typically about 1.2) must be greater than the count of the PBIT determined at F. In other words, the NMCFB must fail with the MCFB nearly as often as the PBIT failed with the MCFB. For example, continuing with the example above, if bit 1 (the PBIT) failed 10 times and bit 2 (the NMCFB) failed on nine of the 10 chips on which bit 1 failed, the equation would be 9×1.2>10, a true statement. For bit 3 (seven failures) and bit 4 (two failures), however, the result of Equation 1 would not result in a true statement.

In Equation 2, the product of the count of the NMCFB determined at F and a second parameter $\beta$ (in the context of bit failure signatures, typically about 2.0) must be greater than or equal to the original count of the NMCFB determined at A3. In other words, the NMCFB must not fail frequently when the MCFB does not fail. For example, continuing with the example above, if bit 2 (the NMCFB) failed a total of nine times and each failure occurred on a chip on which bit 1 failed, the equation would be 9×2.0≧9, a true statement. For bit 3 (seven failures at F), if the total number of failures of bit 3 (i.e., the original count determined at A3) was nine, the equation would be 7×2.0≧9, also a true statement. For bit 4 (two failures at F), however, if the total number of failures of bit 4 (i.e., the original count determined at A3) was five, the equation would be 2×2.0≧5, not a true statement.

As shown in FIG. 1, using the example above, the determination at H includes two distinct determinations, i.e., whether each of Equations 1 and 2 results in a true statement. At H1, it is determined whether Equation 1 results in a true statement. If it does not (i.e., NO at H1), the signature is stored at J and flow returns to B. Upon return to B, a new MCFB is determined and flow continues as above to establish another signature. If Equation 1 does result in a true statement (i.e., YES at H1), it is determined at H2 whether Equation 2 results in a true statement. If it does not (i.e., NO at H2), flow passes back to G. If Equation 2 does result in a true statement (i.e., YES at H2), the NMCFB is added to the signature at I, its count at A2 is set to zero, the NMCFB becomes the PBIT, and flow returns to G.

Therefore, using the example given above, it would be determined at H that the NMCFB (bit 2) tends to fail when the MCFB fails (i.e., YES at H1) and not to fail when the MCFB does not fail (i.e., YES at H2), as each of Equations 1 and 2 above would result in a true statement. Accordingly, at I, the NMCFB would be added to the signature, its A2 count would be set to zero, and PBIT would be set to NMCFB, and flow would return to G. An alternative embodiment at I, would reduce the NCMCFB's A2 count by an amount proportional to the number of chips which have failures of both the NCMCFB and MCFB rather than setting the NCMCFB's A2 count to zero. Steps G through I may be iteratively looped until, as described below, a determination is made at H that a NMCFB does not tend to fail with the MCFB as often or nearly as often as the corresponding PBIT (i.e., Equation 1 does not result in a true statement).

Upon return to G, the NMCFB would be determined to be bit 3, it being the bit not in the signature with the highest failure count at F. The determination at H would be that the NMCFB (bit 3) does not tend to fail with the MCFB (i.e., NO at H), as Equation 1 results in a false statement. Accordingly, the NMCFB (bit 3) would not be added to the signature at I. Rather, the signature would be stored at J and flow would return to B. Upon return to B, a new MCFB is determined and flow continues as above to establish another signature.

It should be stressed that the values given above for parameters α and β are approximations of those useful in the context of identifying bit failure signatures. Other values may be used in this context. Similarly, other values may be used in other contexts, as will be understood by one skilled in the art. Rather than using particular parameter values or even particular equations, the purpose in making these calculations is, as noted above, to identify features that tend to occur together, i.e., a signature. Therefore, any technique or mechanism useful in excluding from the signature those features that often are not present when a first feature is present and also to exclude those features that often are present when the first feature is not present may be employed. The stringency and degree to which these exclusions are made will vary depending, for example, on a user's preference and the context in which the analyses are employed.

Figure 2:
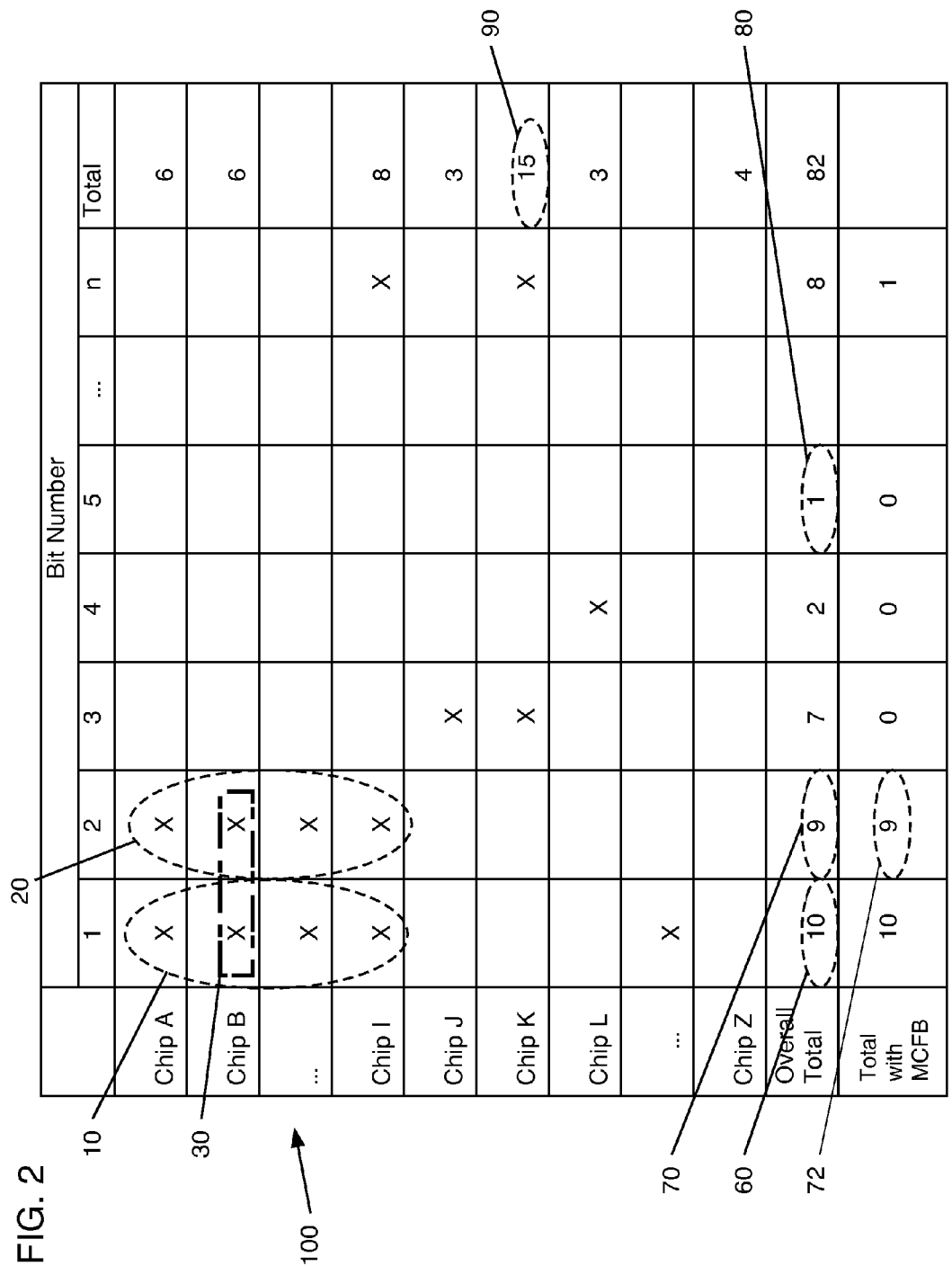
FIG. 2 shows a table of bit failure results for a plurality of semiconductor chips.

Returning to the drawings, FIG. 2 shows a table 100 of the bit failure results described above. As can be seen, table 100 includes a plurality of columns, one for each bit number, and a plurality of rows, one for each chip, in which an X indicates failure of the designated bit on the designated chip. Table 100 is merely illustrative, of course, of the ways in which bit failure results may be organized, and the format provided here is merely for ease of description.

As can be seen by looking at the columns of table 100, bit number 1 is seen to fail on 10 chips among the plurality of chips, bit number 2 has nine failures, bit number 3 has seven failures, etc. Similarly, looking at the rows of table 100, Chip A has a total of six failing bits, including bit numbers 1 and 2, Chip B also has a total of six failing bits, also including bit numbers 1 and 2, Chip I has a total of eight failing bits, including bit numbers 1 and 2, as well as bit number n, etc. It should be recognized that the number of failing bits per chip and the total number of chips failing each bit are provided merely for purposes of illustration and will, of course, vary depending, for example, on the number of bits included on the chips, the number of chips tested, etc.

Still referring to FIG. 2, it can be seen that a group 10 of failures of bit number 1 can be found on Chip A, Chip B, and through Chip I. A similar group 20 of failures of bit number 2 can be found on the same chips. Bit number 1 also fails on one other chip which does not have a bit number 2 failure. While the failure of a single bit across multiple chips, such as that in groups 10 and 20, may suggest a correlation and thus possibly a common reason for the failures on multiple chips, determining the tendency of different bits to fail together can also be useful (and sometimes more useful) in identifying correlations and correcting common causes of bit failure. Accordingly, it is the signature 30 of bit numbers 1 and 2 to fail together on different chips that facilitates such identification. (For the sake of clarity in the drawings, signature 30 is shown with respect only to Chip B, but would be relevant to any chip exhibiting the signature, for example, all nine chips of FIG. 2 which fail bits 1 and 2 exhibit the signature, as described above and as will be further described below.)

As noted above, bit number 1 is determined to be the MCFB based on the bit 1 failure count 60 and bit number 2 to be the NMCFB based on the bit 2 failure count 72. As can be seen in table 100, the count 72 of bit 2 failures occurring with the failure of bit 1 (the MCFB) is equal to the total bit 2 failure count 70. As noted above, determining whether the NMCFB tends to fail with the MCFB at H (FIG. 1) resulted in only bit numbers 1 and 2 being included in the bit failure signature. The other bits did not tend to fail often enough with bit number 1 (the MCFB) to satisfy both Equation 1 and Equation 2, above. Returning flow to B (FIG. 1) repeats the process of identifying a bit failure signature. Rather, the next signature may begin with bit number 3 as the MCFB. It should be understood, of course, that a bit may be included in more than one bit failure signature because future bits considered may have chips failing this MCFB.

Still referring to FIG. 2, other relevant aspects of embodiments of the invention may be illustrated. For example, upon repeatedly returning flow to B (FIG. 1) and identifying the MCFB, a bit with a single failure 80 may be reached, such as bit number 5 in table 100. In such a case, the determination at C (FIG. 1) would be that the MCFB count is less than two and the process would exit without establishing a bit failure signature having bit 5 as the MCFB. That is, a bit that fails only on a single chip among a plurality of chips and a plurality of failing bits cannot be viewed as tending to fail with other failing bits.

Also, it is possible that a chip with a high bit failure count 90, such as that of Chip K, may not be associated with any identified bit failure signature. That is, a chip may exhibit a large number of failing bits not due to a systematic or repeatable process defect.

Once a plurality of bit failure signatures have been identified, as described above, it may be desirable to consolidate the signatures. For example, where a large number of bits, a large number of chips, or both, are analyzed, a large number of bit failure signatures may be identified, some of which may be subsets or supersets of other bit failure signatures. As used herein, a subset bit failure signature refers to a bit failure signature in which each of the failing bits is contained within another bit failure signature. A superset bit failure signature correspondingly refers to a bit failure signature containing all of the failing bits of another bit failure signature. When faced with a plurality of bit failure signatures, a user may choose to: (1) not consolidate any signatures, (2) eliminate subset signatures, or (3) eliminate superset signatures. Embodiments of the invention may be practiced using any of these options. The option chosen will depend, for example, on user preference and context.

For example, four bit failure signatures (A through D) are shown below, along with their failing bits. Choosing no consolidation, all four signatures would be retained for future use.

Signature A: 1, 2, 8, 37, 94, 123
Signature B: 2, 37, 94, 123
Signature C: 1, 8, 37, 94
Signature D: 14, 87, 262

Choosing to eliminate subset signatures would result in retention of Signature A and Signature D because Signatures B and C are comprised entirely of failing bits of Signature A and would therefore be consolidated into Signature A. Signature D has no failing bits in common with the other signatures.

Choosing to eliminate superset signatures would result in retention of Signature B, Signature C, and Signature D because Signature A is comprised entirely of failing bits included in Signature B and Signature C. Again, Signature D has no failing bits in common with the other signatures.

Other methods or criteria for consolidating bit failure signatures may be understood by one skilled in the art and are intended to be within the scope of the present invention. Clustering would be one such method as described, for example, in U.S. Pat. No. 6,880,136. The methods described above are provided merely for purposes of illustration and are not intended to be limiting.

Once bit failure signatures are identified (and optionally consolidated), it is valuable to know how closely the bit failures of individual chips resemble the bit failures of the signatures. For example, FIG. 3 shows a table 200 of scores associated with an illustrative bit failure signature (Signature A). Within table 200, a signature score 210 is given for each chip. Signature score 210 represents the proportion of the bit failures within the signature that are found on the chip. Here, the value of signature score 210 is equal to this proportional percentage times 10. As such, the values of 1000 for Chip A, Chip B, and Chip C indicate that each of the bit failures of Signature A are found on the chips. By comparison, 75%, 60%, 50%, and 10% of the bit failures of Signature A are found on Chip D, Chip E, Chip F, and Chip Z, respectively.

The total score 220 given for each chip represents the total bit failures of the chip that are found within the signature. Taking Chip A, for example, the value of 1000 indicates that all of the chip's failures are found within Signature A. That is, Chip A includes all of the bit failures of Signature A and no other bit failures.

By comparison, referring to Chip C, while its signature score is 1000, its total score is 700. This indicates that Chip C includes all of the bit failures of Signature A but also includes additional bit failures not within Signature A.

The pattern score 230 of each chip failing a bit in the signature is determined as follows. First, for each test pattern p which—when tested on the chips failing a bit in the signature—results in at least one of these chips failing a bit in the signature, calculate percent(p) as the percentage of chips which fail a bit in this signature when tested using pattern p. In other words, percent(p) is the number of chips while will fail a bit in the signature when tested using pattern p divided by the number of chips failing a bit in the signature. This embodiment of the first step is attractive because it considers the patterns which result in failures of a bit in the signature. However, a drawback of this embodiment of this first step is that it can result in a long run time and high memory consumption. An alternative embodiment would not keep track of which patterns resulted in which bits failing for each chip, but instead would only keep track of the patterns which resulted in failures (of any bits) for the chip and the set of bits which failed for the chip (regardless of which test pattern caused the failure). This alternative embodiment can run faster and consume less memory. In this alternative embodiment, in the first step, for each test pattern p which results in a failure for a chip failing a bit in the signature, calculate percent(p) as the percentage of chips failing a bit in this signature which fail when tested using pattern p; in other words, percent(p) would be the number of chips failing a bit in the signature which fail some chip when tested using pattern p divided by the number of chips failing a bit in the signature. For either embodiment, the second step proceeds as follows.

Secondly, calculate:

$$VAR(c) = (\Sigma_{patterns\ p}(\text{Indicator}(c,p) - \text{percent}(p))**2) / \#patterns \quad \text{Eq. 3}$$

where Indicator(c,p) is 1 if chip c failed when tested for pattern p (or in an alternative embodiment which failed a bit in this signature when tested for pattern p) and 0 otherwise. Thirdly, calculate and report the pattern score 230 as 1000 times (1−the square root of VAR(c)) for each chip C which fails a bit in the signature.

The scores in table 200 may be used to report results of the above analyses. For example, an output file or other report may be generated to provide some or all of the following information to a user or an analysis system: the set of bits contained in the bit failure signature, a list of the chips that fail at least one bit in the bit failure signature, the signature score 210 of each chip on the list, the total score 220 of each chip on the list, and the pattern score 230 of each chip on the list.

Other relevant or useful information may also be reported of course, as will be understood by one skilled in the art. For example, it may be desirable to know how similar the bit failures of a chip are to other chips on the list. That is, a pattern commonality may be defined as the degree to which a chip's bit failure test patterns match the bit failure test patterns of an average chip on the list.

In some embodiments of the invention, it may be desirable to iterate such a pattern commonality determination, eliminating outliers in subsequent iterations. For example, assume that 10 chips are reported as having at least one failing bit within a bit failure signature. Assume further that eight of the 10 chips fail each bit of the bit failure signature and no other bits, i.e., they have identical bit failure patterns, and that the other two chips each fail one bit of the bit failure signature but otherwise share no failing bits with the other chips. In such a case, just two iterations of the pattern commonality determination and removal of the chips with the lowest pattern score would result in the eight remaining chips each having a pattern score of 1000, indicating a high pattern commonality.

Figure 4:
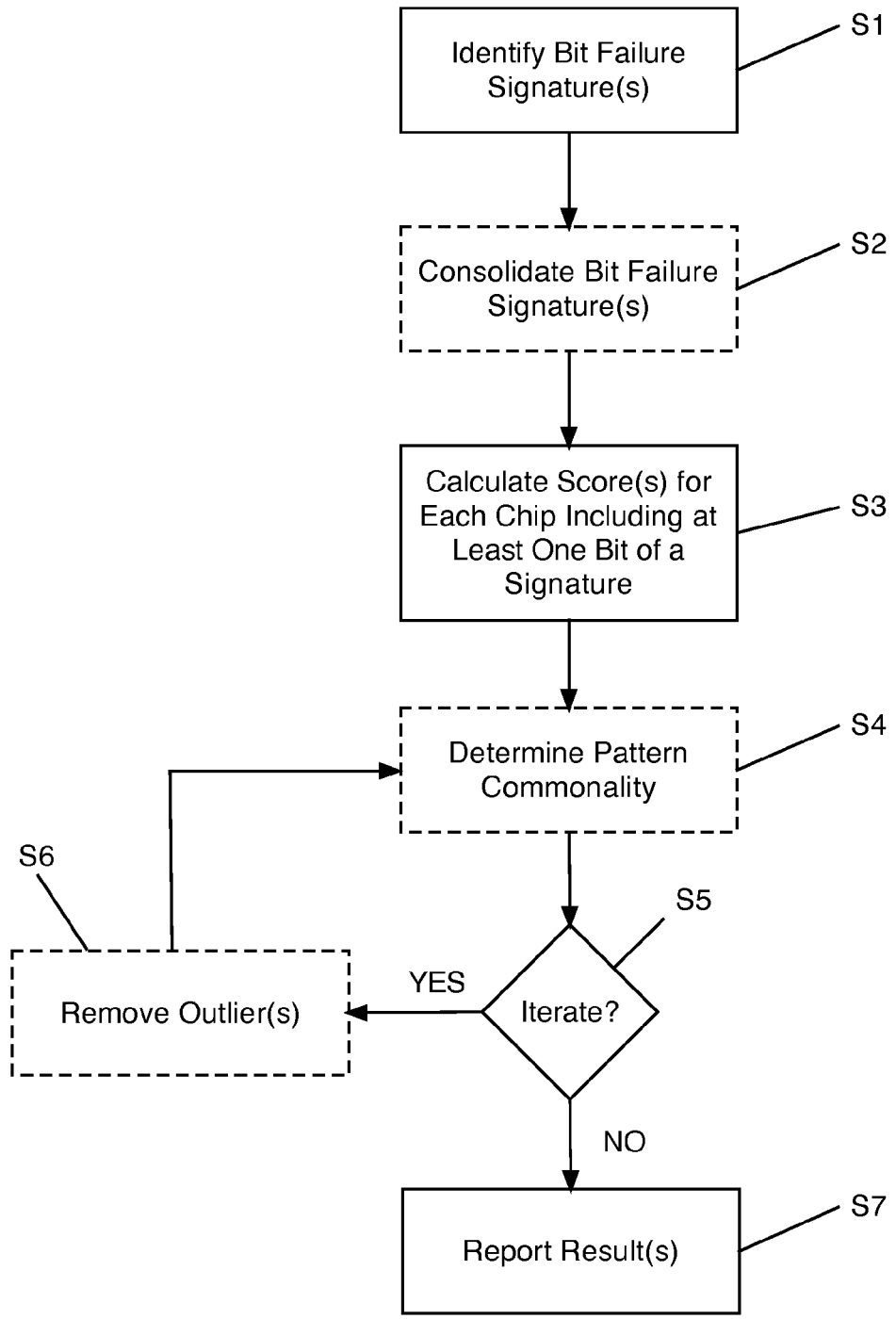
FIG. 4 shows a flow diagram of a method according to an embodiment of the invention.

Returning again to the drawings, FIG. 4 shows a flow diagram of a method according to an embodiment of the invention. At S1, at least one bit failure signature is identified, as described above with respect to FIG. 1. At S2, the bit failure signatures, if more than one, may optionally be consolidated. Such consolidation may be as described above, e.g., by eliminating subsets of other signatures or supersets of other signatures. At S3, at least one score is calculated for each chip including at least one bit of a signature. Such scores may include, for example, the signature scores 210 and total scores 220 of FIG. 3.

At S4, pattern commonality among a plurality of chips with failing bits may optionally be determined. Such determinations may include, for example, the pattern commonality determinations based on standard deviations, as described above. Other methods of determining commonality between and among the plurality of chips will be understood by one skilled in the art, of course, and are within the scope of the present invention.

At S5, a determination is made whether the pattern commonality determination at S4 is to be iterated. If so (i.e., YES at S5), outliers (i.e., results outside a pattern commonality threshold) may optionally be removed at S6 and flow returns to S4. As noted above, outliers may be removed at S6 based, for example, on their standard deviation. If the pattern commonality determination is not to be iterated (i.e., NO at S5), the result(s) of the analyses are reported at S7. The results reported at S7 may include, for example, the signature or signatures identified at 51, the consolidated signatures of S2, the score or scores calculated at S3, the pattern commonality determinations made at S4, the outliers removed at S6, or any combination or subset thereof. Other results may also be of use, of course, depending on the context in which the analyses are made.

In many cases, the results of the analyses described above are used to investigate, identify, detect, diagnose, understand, and/or modify the manufacturing process(es) at issue, although this is not essential. That is, while it is likely that the bit failure signatures identified by embodiments of the invention will be used to improve chip manufacturing processes, it is also possible that the identification of no or few bit failure signatures will constitute a monitoring or quality control measure in and of itself and that the manufacturing process will not be altered based on the analyses described above.

Figure 5:
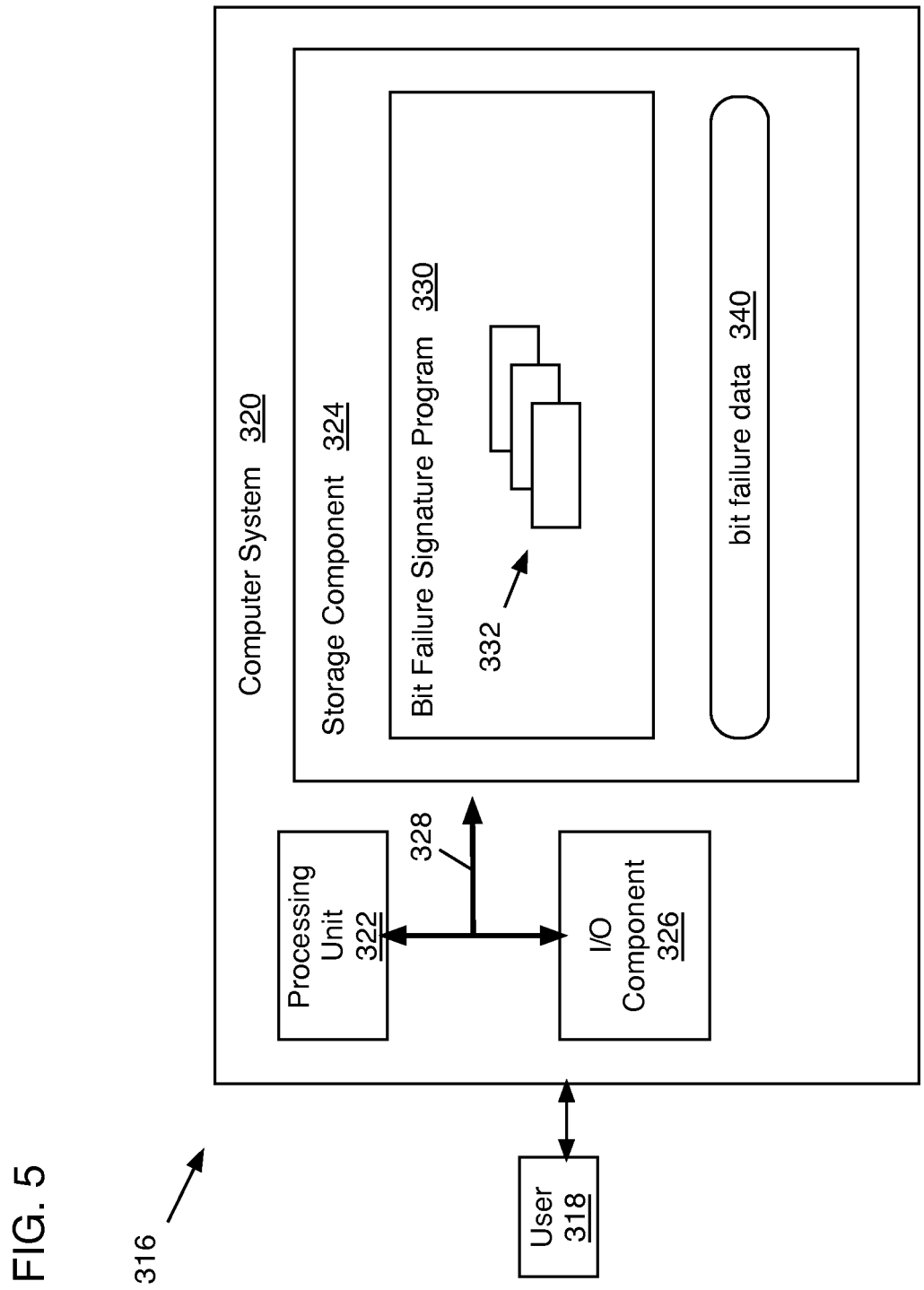
FIG. 5 shows a block diagram of a system according to an embodiment of the invention.

FIG. 5 shows an illustrative environment 316 for identifying a bit failure signature according to an embodiment. Environment 316 includes a computer system 320 that can perform a process described herein in order to identify a bit failure signature. In particular, computer system 320 is shown including a bit failure signature program 330, which makes computer system 320 operable to identify a bit failure signature by performing a process described herein.

Computer system 320 is shown including a processing component 322 (e.g., one or more processors), a storage component 324 (e.g., a storage hierarchy), an input/output (I/O) component 326 (e.g., one or more I/O interfaces and/or devices), and a communications pathway 328. In general, processing component 322 executes program code, such as bit failure signature program 330, which is at least partially fixed in storage component 324. While executing program code, processing component 322 can process data, which can result in reading and/or writing transformed data from/to storage component 324 and/or I/O component 326 for further processing. Pathway 328 provides a communications link between each of the components in computer system 320. I/O component 326 can comprise one or more human I/O devices, which enable a human user 318 to interact with computer system 320 and/or one or more communications devices to enable a system user 318 to communicate with computer system 320 using any type of communications link. To this extent, bit failure signature program 330 can manage a set of interfaces (e.g., graphical user interface(s), application program interface, and/or the like) that enable human and/or system users 318 to interact with bit failure signature program 330. Further, bit failure signature program 330 can manage (e.g., store, retrieve, create, manipulate, organize, present, etc.) the data, such as bit failure data 340, using any solution.

In any event, computer system 320 can comprise one or more general purpose computing articles of manufacture (e.g., computing devices) capable of executing program code, such as bit failure signature program 330, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, bit failure signature program 330 can be embodied as any combination of system software and/or application software.

Further, bit failure signature program 330 can be implemented using a set of modules 332. In this case, a module 332 can enable computer system 320 to perform a set of tasks used by bit failure signature program 330, and can be separately developed and/or implemented apart from other portions of bit failure signature program 330. As used herein, the term "component" means any configuration of hardware, with or without software, which implements the actions described in conjunction therewith using any solution, while the term "module" means program code that enables a computer system 320, such as a general purpose computing device, to implement the actions described in conjunction therewith using any solution. When fixed in a storage component 324 of a computer system 320 that includes a processing component 322, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 320.

When computer system 320 comprises multiple computing devices, each computing device can have only a portion of bit failure signature program 330 fixed thereon (e.g., one or more modules 332). However, it is understood that computer system 320 and bit failure signature program 330 are only representative of various possible equivalent computer systems that may perform a process described herein. To this extent, in other embodiments, the functionality provided by computer system 320 and bit failure signature program 330 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 320 includes multiple computing devices, the computing devices can communicate over any type of communications link. Further, while performing a process described herein, computer system 320 can communicate with one or more other computer systems, such as a system user 318, using any type of communications link. In either case, the communications link can comprise any combination of various types of wired and/or wireless links; comprise any combination of one or more types of networks; and/or utilize any combination of various types of transmission techniques and protocols.

As discussed herein, bit failure signature program 330 enables computer system 320 to identify at least one bit failure signature. To this extent, bit failure signature program 330 is configured to enable computer system 320 to manage bit failure data 340, which computer system 320 can process to identify a bit failure signature. In an embodiment, bit failure data 340 comprises a set of data representing actual bit failures of semiconductor chips.

In another embodiment, the invention provides a method that performs the process steps of the invention on a subscription, advertising, and/or fee basis. That is, a service provider could offer to identify bit failure signatures, as described above. In this case, the service provider can create, maintain, support, etc., a computer infrastructure, such as computer system 320, that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for identifying bit failure signatures. In this case, a computer infrastructure, such as computer system 320, can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computer system, such as computer system 320, from a computer-readable medium; (2) adding one or more computer systems to the computer infrastructure; and (3) incorporating and/or modifying one or more existing systems of the computer infrastructure, to enable the computer infrastructure to perform the process steps of the invention.

It must be understood that embodiments of the invention may be employed in contexts other than the identification of bit failure signatures. For example, embodiments of the invention may be employed in any manufacturing process in which systematic product defects may be attributable to a common manufacturing error or design defect.

Other contexts in which embodiments of the invention may be employed include, for example, genetic analyses. For example, using embodiments of the invention, it may be possible to identify a correlation and possibly a common cause of genetic mutation or pattern of mutation within the genomes of a plurality of organisms. Similarly, it may be possible to identify evolutionary trends between or among a plurality of species by identifying sequence signatures in their nucleic acid and/or amino acid sequences.

In the context of genetic analyses, pattern commonality determinations may include, for example, not only sequence patterns (e.g., a pattern of nucleotides within a sequence), but also the location of the pattern within a genome. For example, a pattern of nucleotides occurring at the same location on the same chromosome of two species may indicate a more recent common ancestry than, for example, the same pattern of nucleotides occurring at different locations on the same chromosome or on different chromosomes of two species. Analogous pattern commonalities may be relevant in other contexts, as will be apparent to one skilled in the art.

Another context in which embodiments of the invention may be employed include, for example, the identification of a common set of words within a plurality of books or a common set of consumer goods purchased by people of a plurality of demographic categories.

The foregoing description of various aspects of the invention has been presented for purposes of illustration and description. It is not intended to be exhaustive or to limit the invention to the precise form disclosed, and obviously, many modifications and variations are possible. Such modifications and variations that may be understood by a person skilled in the art are intended to be included within the scope of the invention as defined by the accompanying claims.

What is claimed is:

1. A method of identifying at least one bit failure signature among a plurality of semiconductor chips, the method comprising:
    employing at least one computing device to perform the steps of:
    counting failures of each failing bit among the plurality of semiconductor chips;
    determining a most commonly failing bit (MCFB) among the failing bits;
    establishing a bit failure signature including the MCFB;
    counting failures of each failing bit on semiconductor chips on which the MCFB fails;
    determining a next most commonly failing bit (NMCFB) among the failing bits on semiconductor chips on which the MCFB fails;
    determining whether the NMCFB tends to fail when the MCFB fails; and
    in response to a determination that the NMCFB tends to fail when the MCFB fails, adding the NMCFB to the bit failure signature.

2. The method of claim 1, wherein the counting failures of each failing bit among the plurality of semiconductor chips includes listing, for each failing bit, each of the plurality of semiconductor chips containing the failing bit.

3. The method of claim 1, further comprising employing the at least one computing device to perform the step of:
    determining whether the number of failures of the MCFB is less than two.

4. The method of claim 1, wherein the counting failures of each failing bit on semiconductor chips on which the MCFB fails includes determining the bits that fail on semiconductor chips on which the MCFB fails.

5. The method of claim 1, wherein determining whether the NMCFB tends to fail when the MCFB fails includes determining:
    whether a product of the number of failures of the NMCFB on semiconductor chips on which the MCFB fails and a first parameter is greater than the number of failures of the MCFB; and
    whether a product of the number of failures of the NMCFB on semiconductor chips on which the MCFB fails and a second parameter is greater than or equal to a total number of failures of the NMCFB,
    wherein the first parameter is about 1.2 and the second parameter is about 2.0.

6. The method of claim 1, further comprising employing the at least one computing device to perform the steps of:
    determining a new NMCFB among the failing bits on semiconductor chips on which a PBIT fails and which is not included in the bit failure signature;
    determining whether the new NMCFB tends to fail when the PBIT fails; and
    in response to a determination that the new NMCFB tends to fail when the PBIT fails, adding the new NMCFB to the bit failure signature.

7. The method of claim 1, further comprising employing the at least one computing device to perform the step of:
    identifying semiconductor chips within the plurality of semiconductor chips having at least one failing bit included in the bit failure signature.

8. The method of claim 7, further comprising employing the at least one computing device to perform the step of:
    calculating a score for each semiconductor chip having at least one failing bit included in the bit failure signature, the score reflecting how closely the bit failures of the semiconductor chip match the bit failure signature.

9. The method of claim 7, further comprising employing the at least one computing device to perform the step of:
    determining a pattern commonality among the identified semiconductor chips.

10. The method of claim 9, wherein the determining the pattern commonality includes determining a standard deviation from an average bit failure pattern for each of the identified semiconductor chips.

11. The method of claim 10, further comprising employing the at least one computing device to perform the step of:
    removing from the identified semiconductor chips the semiconductor chip having the highest standard deviation.

12. The method of claim 1, wherein the at least one bit failure signature includes a plurality of bit failure signatures.

13. The method of claim 12, further comprising employing the at least one computing device to perform the step of:
consolidating the plurality of bit failure signatures.

14. The method of claim 13, wherein the consolidating the plurality of bit failure signatures includes eliminating at least one bit failure signature that is a subset of another bit failure signature.

15. The method of claim 13, wherein the consolidating the plurality of bit failure signatures includes eliminating at least one bit failure signature that is a superset of other bit failure signatures.

16. A computer system comprising:
a set of computing devices configured to identify at least one bit failure signature by performing actions comprising:
counting failures of each failing bit among the plurality of semiconductor chips;
determining a most commonly failing bit (MCFB) among the failing bits;
establishing a bit failure signature including the MCFB;
counting failures of each failing bit on semiconductor chips on which the MCFB fails;
determining a next most commonly failing bit (NMCFB) among the failing bits on semiconductor chips on which the MCFB fails;
determining whether the NMCFB tends to fail when the MCFB fails; and
in response to a determination that the NMCFB tends to fail when the MCFB fails, adding the NMCFB to the bit failure signature.

17. The computer system of claim 16, wherein the actions further comprise:
determining a new NMCFB among the failing bits on semiconductor chips on which a PBIT fails and which is not included in the bit failure signature;
determining whether the new NMCFB tends to fail when the PBIT fails; and
in response to a determination that the new NMCFB tends to fail when the PBIT fails, adding the new NMCFB to the bit failure signature.

18. The computer system of claim 16, wherein the actions further comprise:
identifying chips within the plurality of semiconductor chips having at least one failing bit included in the bit failure signature;
calculating a score for each semiconductor chip having at least one failing bit included in the bit failure signature, the score reflecting how closely the semiconductor chip matches the bit failure signature; and
determining a pattern commonality among the identified semiconductor chips.

19. A computer program comprising program code embodied in at least one computer-readable storage medium, which when executed, enables a computer system to implement a method of identifying at least one bit failure signature among a plurality of semiconductor chips, the method comprising:
counting failures of each failing bit among the plurality of semiconductor chips;
determining a most commonly failing bit (MCFB) among the failing bits;
establishing a bit failure signature including the MCFB;
counting failures of each failing bit on semiconductor chips on which the MCFB fails;
determining a next most commonly failing bit (NMCFB) among the failing bits on semiconductor chips on which the MCFB fails;
determining whether the NMCFB tends to fail when the MCFB fails; and
in response to a determination that the NMCFB tends to fail when the MCFB fails, adding the NMCFB to the bit failure signature.

20. The computer program claim 19, wherein the method further comprises:
determining a new NMCFB among the failing bits on chips on which a PBIT fails and which is not included in the bit failure signature;
determining whether the new NMCFB tends to fail when the PBIT fails; and
in response to a determination that the new NMCFB tends to fail when the PBIT fails, adding the new NMCFB to the bit failure signature.

21. The computer program of claim 19, wherein the method further comprises:
identifying chips within the plurality of chips having at least one failing bit included in the bit failure signature;
calculating a score for each chip having at least one failing bit included in the bit failure signature, the score reflecting how closely the chip matches the bit failure signature; and
determining a pattern commonality among the identified chips.

22. A method of identifying a physical feature signature among a plurality of items, the method comprising:
employing at least one computing device to perform the steps of:
counting occurrences of each of a plurality of physical features among a plurality of items;
determining a most commonly occurring physical feature among the plurality of physical features;
establishing a physical feature signature including the most commonly occurring physical feature;
counting occurrences of each physical feature occurring with the most commonly occurring physical feature among the plurality of items;
determining a next most commonly occurring physical feature among the physical features occurring with the most commonly occurring physical feature;
determining whether the next most commonly occurring physical feature tends to occur with the most commonly occurring physical feature; and
in response to a determination that that the next most commonly occurring physical feature tends to occur with the most commonly occurring physical feature, adding the next most commonly occurring physical feature to the physical feature signature.

23. The method of claim 22, further comprising employing the at least one computing device to perform the steps of:
identifying items within the plurality of items including at least one physical feature included in the physical feature signature;
calculating a score for each item including at least one physical feature included in the physical feature signature, the score reflecting how closely the physical features of the item match the physical feature signature; and
determining a pattern commonality among the identified items.

* * * * *